United States Patent
Yao et al.

(10) Patent No.: US 11,482,468 B2
(45) Date of Patent: Oct. 25, 2022

(54) POWER MODULE PACKAGE CASING WITH PROTRUSION SUPPORTS

(71) Applicant: SEMICONDUCTOR COMPONENTS INDUSTRIES, LLC, Phoenix, AZ (US)

(72) Inventors: Yushuang Yao, Shenzhen (CN); Vemmond Jeng Hung Ng, Senawang (MY); Chee Hiong Chew, Seremban (MY); Qing Yang, Shenzhen (CN)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/865,962

(22) Filed: May 4, 2020

(65) Prior Publication Data

US 2021/0343620 A1    Nov. 4, 2021

(51) Int. Cl.
*H01L 23/40* (2006.01)
*H01L 23/495* (2006.01)

(52) U.S. Cl.
CPC .... *H01L 23/4006* (2013.01); *H01L 23/49544* (2013.01); *H01L 2023/405* (2013.01)

(58) Field of Classification Search
CPC ........... H01L 23/4006; H01L 23/49544; H01L 2023/405
See application file for complete search history.

(56) References Cited

U.S. PATENT DOCUMENTS

| | | | | |
|---|---|---|---|---|
| 5,497,289 A * | 3/1996 | Sugishima | ............ | H02M 7/003 318/558 |
| 5,835,350 A * | 11/1998 | Stevens | .................. | H05K 3/284 361/704 |
| 7,145,084 B1 * | 12/2006 | Sarihan | ................. | H01L 23/041 174/361 |
| 7,351,107 B1 * | 4/2008 | Burlock | ................. | H05K 3/308 439/607.37 |
| 2012/0218149 A1 * | 8/2012 | Edward | ................. | H01Q 21/08 342/368 |
| 2020/0068752 A1 * | 2/2020 | Badihi | ................. | C09D 175/04 |

* cited by examiner

*Primary Examiner* — Peniel M Gumedzoe
(74) *Attorney, Agent, or Firm* — Brake Hughes Bellermann LLP

(57) ABSTRACT

A method includes disposing a series of protrusions on a rectangular side panel of an open four-sided box-like structure in a frame, and attaching an electronic substrate to the frame. The electronic substrate carries one or more circuit components. The series of protrusions acts as a spring-like compensator to compensate plastic deformation, twisting or warping of the frame, and to limit propagation of stress to the electronic substrate via the frame.

20 Claims, 9 Drawing Sheets

```
┌─────────────────────────────────────────────────────────┐
│  Dispose a jagged edge on a rectangular side panel of an open
│         four-sided box-like structure in a frame
│                          510
└─────────────────────────────────────────────────────────┘
                              │
┌─────────────────────────────────────────────────────────┐
│          Attach an electronic substrate to the frame
│                          520
└─────────────────────────────────────────────────────────┘
                              │
┌─────────────────────────────────────────────────────────┐
│  Dispose the frame and attached electronic substrate in a package
│                         cover
│                          530
└─────────────────────────────────────────────────────────┘
```

FIG. 5

POWER MODULE PACKAGE CASING WITH PROTRUSION SUPPORTS

TECHNICAL FIELD

This description relates to power device module packages.

BACKGROUND

It may be desirable in some applications to engineer and manufacture power devices to provide sufficient performance, cost, and reliability. Semiconductor power devices can be often manufactured discretely as opposed to being integrated in an integrated circuit (IC) process. As is typical with power devices, thermal performance may dictate failure rates when components are heated above certain temperatures. Thus, a need exists for systems, methods, and apparatus to address the shortfalls of present technology and to provide other new and innovative features.

SUMMARY

A package includes an electronic substrate coupled to at least one circuit component. The electronic substrate is attached to a frame in the package. The frame is an open four-sided box-like structure. A rectangular panel forming a side of the open four-sided box-like structure has a length and a width. At least one protrusion is disposed on a top edge of the rectangular panel along the length of the panel.

A method includes disposing a series of protrusions on a rectangular side panel of an open four-sided box-like structure included in a frame, and attaching an electronic substrate to the frame. The electronic substrate is coupled to at least one circuit component.

In an aspect, disposing the series of protrusions includes disposing at least one protrusion and at least one dimple on the edge along a length of the rectangular side panel.

In a further aspect, disposing the at least one protrusion and at least one dimple includes disposing an oblique protrusion having a slanted position along the length of the rectangular side panel.

In yet another aspect, disposing the at least one protrusion and at least one dimple includes disposing non-oblique protrusions and non-oblique dimples along the length of the rectangular side panel.

BRIEF DESCRIPTION OF THE DRAWINGS

FIG. 5 illustrates an example method for limiting propagation of stress to an electronic substrate enclosed in a power module package.

DESCRIPTION

The disclosure herein is directed to frames to hold power electronic substrates in power module packages. The frames are shaped to reduce the risk of damage to power electronic substrates (e.g., damage due to plastic deformation, twisting or warping of the package cover or of the frame). The modules and packages described herein include high power devices that are assembled together into a single package. For example, the packages can include multiple semiconductor die (e.g., silicon semiconductor die, silicon carbide (SiC) semiconductor die, insulated-gate bipolar transistors (IGBTs), metal-oxide-semiconductor field effect transistor (MOSFET) die, etc.) that may be assembled together to provide high performance, reliability, and/or improvement in thermal management while maintaining proper electrical performance of the module or package.

In some implementations, the packages described herein can be used in applications with high voltages (e.g., higher than 600 V), high current densities (e.g., between 100 A to 800 A (e.g., 400 A)), and/or high switching frequencies (e.g., greater than 1 kHz). In some implementations, the packages can be used in a variety of applications including, for example, automotive applications (e.g., automotive high power module (AHPM), electrical vehicles, and hybrid electrical vehicles), computer applications, industrial equipment, traction invertors, on-board charging applications, inverter applications, and/or so forth. In some implementations, one or more of the semiconductor die described herein can include, or can be, at least a portion of an automotive high power module (AHPM) power device.

Inverters for industrial applications (e.g., automotive inverters) can incorporate a wide variety of components, including insulated-gate bipolar transistor (IGBT) power devices, fast recovery diodes (FRDs), high-voltage DC line capacitors, main circuit bus bars, a power module drive circuit board, a motor control circuit board, three-phase current sensors, and DC and heavy-current AC connectors, etc.

Figure 1:
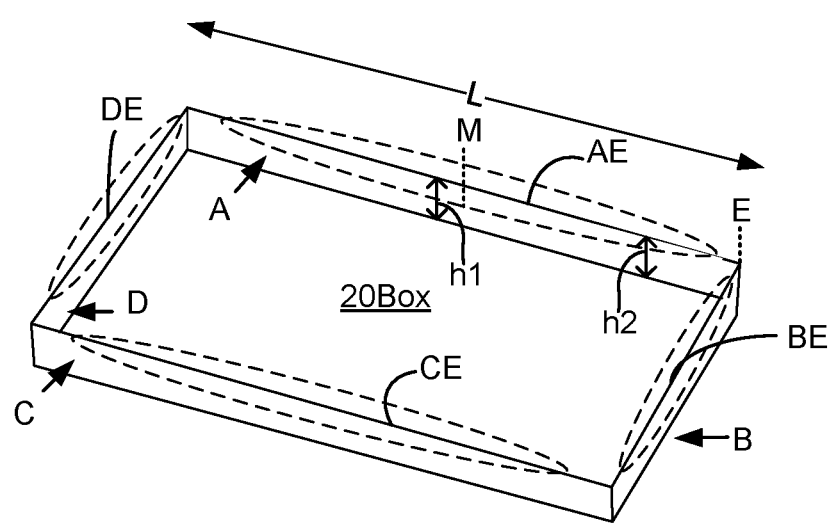
FIG. 1 is a schematic illustration of an example frame.

FIG. 1 is a schematic illustration of an example frame 20 to which a power electronic substrate can be attached for enclosure in a package. Frame 20 may include an open rectangular box 20Box (with four sides, and no top or bottom) formed by four generally rectangular side panels (e.g., panels A, B, C and D). In accordance with the principles of the present disclosure, the panels may be shaped to reduce the risk of damage to the power electronic substrate attached to the frame in the package.

In the example shown in FIG. 1, each of the panels has a respective length and varying heights. For example, panel A has a length L and heights (h) that vary along the length L of the panel A. For example, panel A may have a height h1 at about a middle (M) of the panel A and a different (e.g., shorter) height h2 near an edge (E) of the panel A.

In some implementations, the panel A (and/or another of the panels B, C, D) may have a maximum height that is centered at a mid-point of the panel length L and a different height near an edge (E) of the panel. In some implementations, the panel A (and/or another of the panels B, C, D) may have a maximum width that is not centered along the length L of the panel A.

In accordance with the principles of the present disclosure, panel edges (e.g., AE, BE, CE, and DE) may be shaped to vary the panel heights along the lengths of the panels (e.g., L). In FIG. 1, in which the panel edges (e.g., AE, BE, CE, and DE) may appear to be level and the panel heights h (e.g., h1 and h2) may appear to be the same because of the scale used for the figure, the varying panel heights along the lengths of the panels are represented by the dashed oval lines.

Although not explicitly shown in FIG. 1, in some implementations, one or more of the panel edges AE through DE (or a portion thereof) can have protrusions (e.g., series of protrusions, evenly separated protrusions, protrusions separated in a defined fashion) and/or dimples (e.g., recesses). Specifically, one or more of the panels edges AE through DE (or a portion thereof) can have, for example, a series of protrusions. For example, the series of protrusions can have one or more square, triangular, trapezoidal, curved, or rounded protrusions of equal or unequal lengths and/or heights.

In some implementations, protrusions and/or dimples can be included along at least a portion of the edges in addition to the heights (e.g., h1, h2) varying along the length (e.g., L) as described above. In some implementations, one or more of the panel edges AE through DE (or a portion thereof) can have protrusions and/or dimples (e.g., recesses) without a varying height along the length of the one or more panels AE through DE. In some implementations, the protrusions and/or dimples (e.g., series of protrusions) on a panel of the frame 20 may function as a spring-like compensator compensating plastic deformation, and twisting or warping of the frame to prevent the stress from propagating to an attached substrate.

Figure 2A:
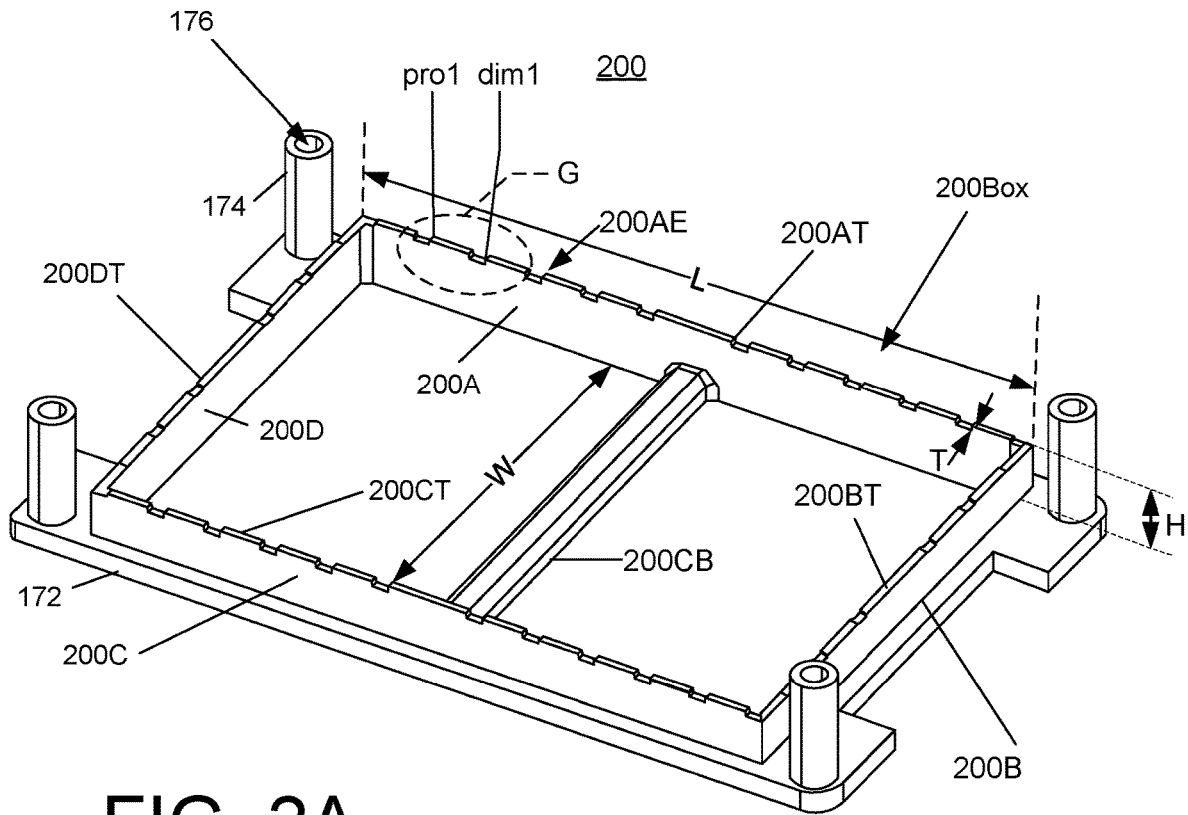
FIG. 2A is a schematic illustration of an example frame.

FIG. 2A shows an example frame 200 shaped to reduce the risk of damage to a power electronic substrate in a package. Frame 200 may be made of plastic or polymeric materials.

Frame 200 may reduce the risk of damage to the power electronic substrate attached to, held by, or fitted in, the frame, for example, by having shaped frame structures (e.g., top edge surfaces of panels) to limit transmission of stress to the power electronic substrate.

In accordance with the principles of the present disclosure, protrusions are disposed on top edge surfaces of structural beams (e.g., panels) of a frame (to which a power electronic substrate is attached, held by, or fitted in). The protrusions can limit propagation of stress to the power electronic substrate via the frame.

In an example implementation, shown in FIG. 2A, frame 200 includes panels 200A, 200B, 200C and 200D forming four sides of an open rectangular box 200Box. Rectangular box 200Box may have a length L, a width W, and a height H. Frame 200 may include posts 174 attached to four corners of the rectangular box. A planar support plate 172 may support and join rectangular box 200Box and posts 174. In example implementations, the dimensions (L, W, or H) of each side of rectangular box 200Box may be on the order of the tens of millimeters.

Panels 200A, 200B, 200C and 200D may have rectangular plank-like shapes. For example, panel 200A may be a generally rectangular plank (e.g., a rectangular plank having a length L, a height H, and a thickness T). In example implementations, the dimensions of each side of panel 200A may be in an order of millimeters or several tens of millimeters. In an example implementation, length L may be between 20 and 200 millimeters, height H may be, for example, between 2 and 10 millimeters, and thickness T may be, for example, between 0.5 and 3.0 millimeters.

Figure 2B:
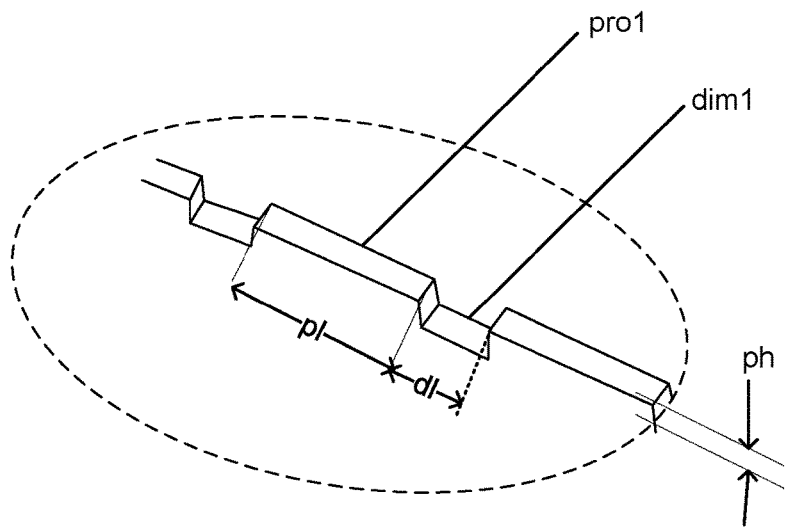
FIG. 2B illustrates a zoomed in view of protrusions and dimples of the frame shown in FIG. 2A.

In an example implementation, panel 200A may have a series of protrusions 200AE along a length L of the panel. Series of protrusions 200AE may be formed by alternating protrusions (e.g., pro1) and dimples (e.g., dim1) disposed on edge the along the length L of the panel. FIG. 2B shows a zoomed in view of a portion G of series of protrusions 200AE. The protrusions (e.g., pro1) and dimples (e.g., dim1) may have rectangular shapes (or profiles). An example protrusion (e.g., pro1) may have a height (or thickness) ph, and a length pl. An example dimple (e.g., dim1) may have a length pw and a same height (depth) ph as the adjacent protrusion (e.g., pro1).

The series of protrusions on panel 200A may act as a spring-like compensator compensating plastic deformation, and twisting or warping of the frame. Although shown as having a particular shape shown in FIGS. 2A and 2B, the series of protrusions can have a different shape than shown in FIGS. 2A and 2B. For example, the series of protrusions can have one or more square, triangular, trapezoidal, curved, or rounded protrusions of equal or unequal length (e.g., horizontal direction along the length of the panel) and/or heights (e.g., vertical direction along the height of the panel).

In frame 200, panels 200B, 200C, and 200D may have rectangular shapes similar to rectangular shape of panel 200A. Panels 200A, 200B, 200C, and 200D may be joined vertically along their heights to form rectangular box 200Box (length L, width W, height H) in frame 200. Although the profile of the frame 200 is shown in FIG. 2A as having a rectangular shape (e.g., rectangular box 200Box), the shape of the frame 200 can be different than shown in FIG. 2A. For example, the shape of the frame 200 can have, for example, a square shape or profile.

In frame 200, a planar support plate 172 (e.g., an open rectangular annular structure) may form a foundation or support base to support rectangular box 200Box and posts 174. Panels 200A, 200B, 200C, and 200D and planar support plate 172 may function as mechanical structural beams of rectangular box 200Box.

Further, a cross-beam (e.g., beam 200CB) may provide structural support to hold apart panels on opposite sides (e.g., panels 200A, 200C) of rectangular box 200Box.

Posts 174 may have openings or screw holes 176 to receive bolts or screws (e.g., screw163, FIG. 1B), for example, to mechanically affix a package (e.g., perimeter rim 162 of cover 160, package 10, FIG. 1B) to a heat dispersal assembly (e.g., heat dispersal assembly 155, FIG. 1B).

The disclosure herein provides frames (e.g., frame 200, FIG. 2A) that are shaped to reduce the risk of damage to power electronic substrates (e.g., DBM substrate 120) enclosed in power module packages.

Figure 2C:
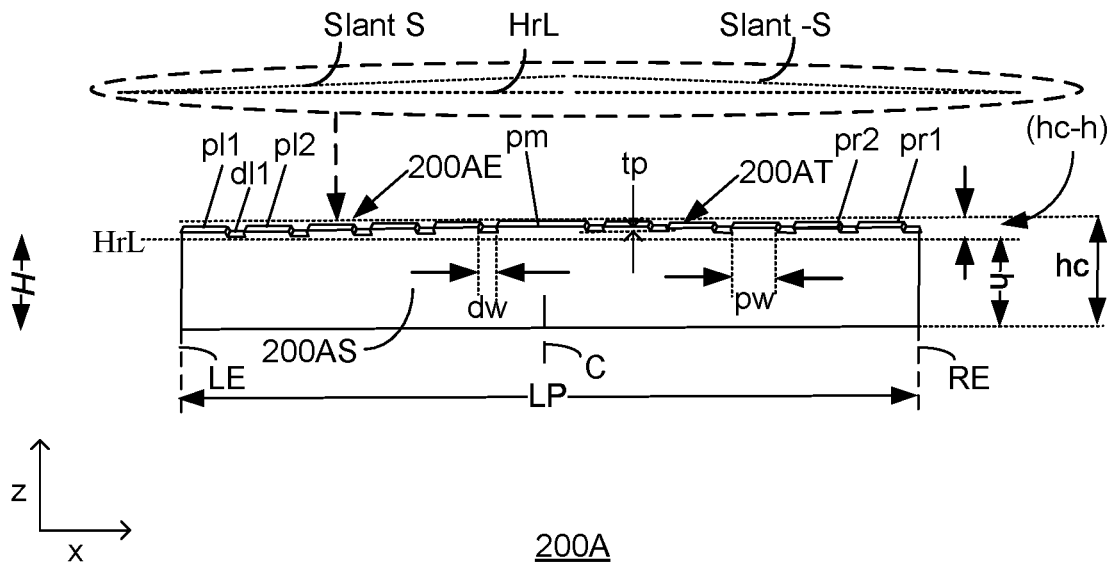
FIG. 2C is a schematic illustration of an example side panel of the frame of FIG. 2A.

In accordance with the principles of the present disclosure, one or more protrusions and dimples are disposed on the top edge surface (e.g., surface 200AT) of at least one of the panels 200A, 200B, 200C and 200D in frame 200. FIG. 2C shows, for example, a perspective view of panel 200A, having a planar front surface 200AS, and a top edge surface 200AT along edge 200AE of the plank.

The protrusions and dimples (e.g., pro1 and dim1) may limit stress, which may be induced, for example, by a screw mounting processes (e.g., for affixing the power electronic substrate held or fitted in the frame to a heat dispersal assembly) from propagating through the frame to the power electronic substrate. The protrusions and dimples may, for example, act as spring-like compensators when a package cover is pressed downward during processes for mounting the power electronic substrate on the heat dispersal assembly (e.g., a heat sink). The protrusions and dimples may at least partially compensate for any plastic deformation, and twisting or warping of the package cover and the frame during package mounting processes.

In an example implementation, shown in FIG. 2C, a series of protrusions (e.g., pl1, pl2, ..., pm, ..., pr2, pr1) project up from top edge surface 200AT in a vertical direction (z direction). Adjacent protrusions may be separated by a recessed portion or dimple. For example, adjacent protrusions pl1 and pl2 may be separated by a dimple dl1. Protrusion pm may be a protrusion protruding out in the vertical direction (z direction) from top edge surface 200AT at about at the middle of the panel (e.g., at or near center axis C). Protrusion pl1 and protrusion pr1 may be edge protrusions at about a left edge (L) and a right edge (R) of panel 200A. The other protrusions (e.g., protrusion pl2, protrusion pr2, etc.) may lie between the protrusion at the middle of the panel (i.e., protrusion pm) and the edge protrusions (e.g., protrusions pl1 and pr1). The protrusions (and dimples) may have any shape profile (e.g., a rectangular, a trapezoidal, a triangular, or a curved shape profile). Each of the protrusions may have a height or thickness (e.g., tp) in a vertical direction (z-axis). In example implementations, the protrusions may have the same or similar heights tp in the vertical direction. In example implementations, the heights tp may be of the order of a fraction of a millimeter (e.g., in a range of 0.1 millimeter to 0.5 millimeter).

The protrusions and dimples may give a jagged appearance or structure to the panel edge. The jagged structure (protrusions and dimples) may be spring-like compensators compensating plastic deformation, and twisting or warping, of the frame.

In some example implementations, each of the protrusions (e.g., pl1, pl2, ..., pm, ..., pr2, pr1) may be an oblique protrusion (dimple) having a slanting or tilted position (neither perpendicular nor horizontal) along the x axis on the top edge surface (e.g., surface 200AT). The slanting or tilted position may be in an oblique slant direction or angle that is neither perpendicular nor horizontal to the x axis.

Figure 2D:
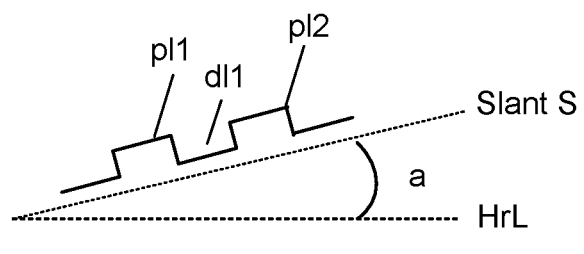
FIG. 2D is a schematic illustration of oblique protrusions and dimples disposed in an oblique slanting direction.

FIG. 2C shows, for example, oblique directions of the slanting or tilted position of the protrusions as a slant S and a slant −S relative to a horizontal level HrL (parallel to the x-axis). FIG. 2D shows, for example, the oblique protrusions (e.g., pl1, pl2) and dimples (e.g., dimple dl1) disposed on slant S at a slant angle a relative to horizontal level HrL (parallel to the x-axis) of the panel.

In an example implementation, as shown in FIG. 2D, slant S (for protrusions in the left half of the panel (e.g., pl1, pl2, ..., pm,) may rise in the vertical direction from edge LE toward the middle of panel 200A. Although not shown in FIG. 2D, in an example implementation, slant −S (for protrusions in the right half of the panel (e.g., pm, ..., pr2, pr1)) may rise in the vertical direction from edge R toward the middle of panel 200A.

In example implementations, as shown for example in FIGS. 2C and 2D, slant S (and slant −S) may be at a substantially constant slant angle a relative to horizontal level HrL over substantial portions of the panel. In some example implementations, slant angle a may vary along the length of the panel. For example, the slant angle a may be steeper (larger) near edge L than the slant angle a at about the middle of panel 200A.

In an example implementation, each of the oblique protrusions (e.g., pl1, pl2, ..., pm, ..., pr2, pr1) may have (but need not have) about a same vertical height or thickness (e.g., thickness tp). Adjacent dimples (e.g., dimple dl1) may have about a same vertical depth (−tp). Each of the oblique protrusions may have about (but need not have) a same width (e.g., width pw). Similarly, the dimples may have about (but need not have) a same width (e.g., width dw). In example implementations, an oblique protrusions (e.g., pl1, pl2, ..., pm, ..., pr2, pr1) may be disposed on slant S (or −S) with its vertical height or thickness (e.g., thickness tp) perpendicular (normal) to the slant direction. In example implementations, an oblique protrusion (e.g., pl1, pl2, ..., pm, ..., pr2, pr1) may be disposed on slant S (or −S) with its vertical height or thickness (e.g., thickness tp) generally perpendicular to horizontal level HrL (i.e., along the z-axis normal to HrL). In some implementations, an oblique protrusion (e.g., pl1, pl2, ..., pm, ..., pr2, pr1) may be normal to an angle between slant S and horizontal level HrL.

In example implementations, different oblique protrusions (e.g., pl1, pl2, ..., pm, ..., pr2, pr1) may have different or unequal heights. The different oblique protrusions (e.g., pl1, pl2, ..., pm, ..., pr2, pr1) may have a distribution of corresponding vertical heights. In an example implementation, the distribution of corresponding vertical heights may have a linear profile over at least a portion of the series of protrusions (e.g.,pl1, pl2, ..., pm, ..., pr2, pr1) (e.g., with the vertical heights increasing linearly from a vertical height of protrusion p12 at the left edge LE toward a greater vertical height of a protrusion at about the middle of the panel, etc.). In example implementations, the distribution of corresponding vertical heights may have a convex profile (e.g. with vertical heights decreasing non-linearly from the vertical height of protrusion pl1 at the left edge LE toward a smaller vertical height of a protrusion at about the middle of the panel, etc.), or a concave profile (e.g. with vertical heights increasing non-linearly from the vertical height of protrusion pl1 at the left edge LE toward a greater vertical heights of protrusions toward the middle of the panel, etc.), or a plateau-shaped profile (e.g., with a group of protrusions about the middle of the panel having about the same vertical heights, etc.).

In an example symmetric configuration of panel 200A, the oblique slant or tilt of the oblique protrusions, for one series (e.g., pl1, pl2, ..., pm), may be directed vertically upward from edge LE toward the middle of panel 200A (e.g., along slant S), and for a second series (e.g., pr1, pr2, ..., pm) directed vertically upward from edge R toward the middle of panel 200A (e.g., along slant −S). The series of oblique protrusions disposed on surface 200AT may result in panel 200A having a height h at edges LE and RE, and a height hc at a middle of the panel (at about center axis C). The height hc at the middle of panel 200A may be greater than the height h at the edges LE and RE. In other words, surface 200AT at about the middle of panel 200A may be protrude out a vertical distance (hc−h) in the z axis direction more than the surface 200AT height h at edges LE and RE.

In an example implementation, height h at edges LE and RE may be between about 2.0 millimeters and 10 millimeters, and vertical distance (hc−h) may be in the range of a fraction of a millimeter (e.g., 0.1 millimeter) to a few millimeters (e.g., 2.0 millimeters).

In frame 200, top edge surfaces 200BT, 200CT and 200DT of panels 200B, 200C and 200D, may have similar or analogous arrangements of oblique protrusions (e.g., pl1, pl2, ..., pm, ..., pr2, pr1) (and dimples) resulting in the top edge surfaces protruding out a similar distance (hc−h) in a vertical direction at about the middle of panels.

In example implementations, as shown in FIGS. 2C and 2D, the oblique protrusions (e.g., pl1, pl2, ..., pm, ..., pr2, pr1) (and dimples) have generally rectangular shapes or profiles (e.g., in the x-z plane). In example implementations, one or more of the oblique protrusions may have another shape or profile (e.g., triangular, trapezoidal, bent rectangle, rounded rectangle, square, triangular, sawtooth, circular, oval, etc.).

In some example implementations, the protrusions in a series of protrusions (and dimples) disposed on the top edge surface of at least one of panels 200A, 200B, 200C and 200D may have unequal or different vertical heights. The protrusions (and dimples) having different vertical heights may be disposed without an oblique slant or tilt on a top edge surface (e.g., surface 200BT) of a panel (e.g., panel 200B). Bottom surfaces (e.g., bottom d1*b*, dimple d1, FIG. 2E) of the dimples in the series may be disposed at a same (e.g., substantially same) horizontal level (e.g., HrL) along the panel length LP.

Figure 2E:
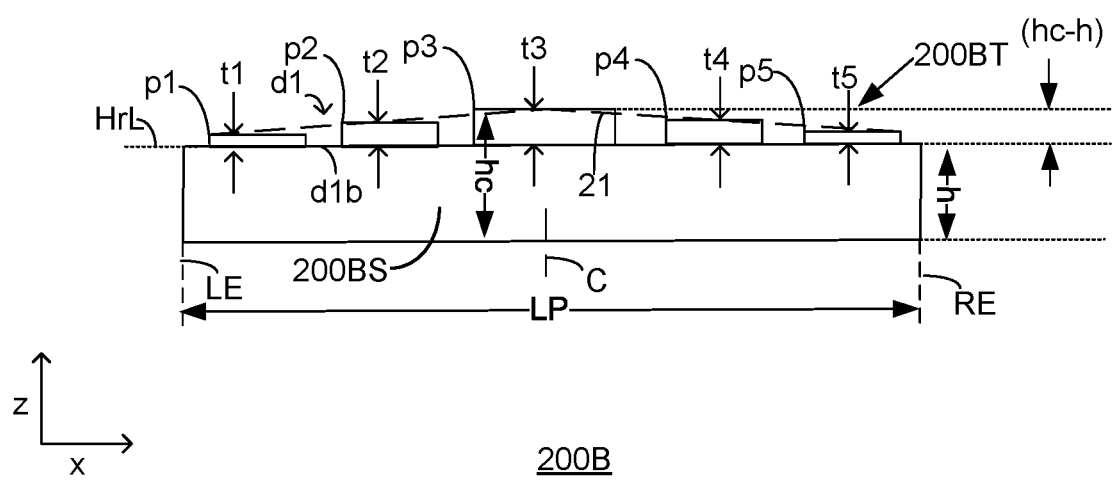
FIG. 2E is a schematic illustration of an example side panel of the frame of FIG. 2A.

FIG. 2E shows, for example, a side view of panel 200B with a top edge surface 200BT having a series of protrusions (and dimples) of unequal or different heights (e.g., thicknesses) disposed on the top edge surface (e.g., surface 200BT).

In the example shown in FIG. 2D, a series of protrusions (e.g., five protrusions: p1, p2, p3, p4, and p5) project out from top edge surface 200BT in a vertical direction (z direction). Protrusion p3 may be a protrusion disposed at about the middle of the panel (e.g., at or near center axis C). Protrusion p1 and protrusion p5 may be edge protrusions at about a left edge and a right edges (LE and RE) of panel 200B. Adjacent protrusions may be separated by a recessed portion or dimple. For example, protrusions p1 and p2 may be separated by dimple d1.

Protrusions p1, p2, p3, p4, and p5 may, for example, have vertical height t1, t2, t3, t4, and t5, respectively. The vertical height may be measured with respect to a same horizontal level HrL across the length of the panel. Intermediate dimples between the protrusions (e.g., dimple d1 between protrusion p1 and p2) may have bottom surfaces (e.g., bottom d1*b*) that are at about the same horizontal level HrL across the length of the panel. In other words, the protrusions (e.g., p1, p2, p3, p4, and p5) (and dimples) are disposed without an oblique slant or tilt on the top edge surface along the horizontal length of the panel.

The protrusions (e.g., p1, p2, p3, p4, and p5) may have equal or unequal vertical heights. In the example of the five protrusions (e.g., p1, p2, p3, p4, and p5) shown in FIG. 2E, height t3 of protrusion p3 may be the largest height. Further, height t1 may be equal to height t5, and height t2 may be equal to height t4, with height t5 less than height t4 and both height t4 and height t5 less than height t3. As a result of this distribution of protrusion heights, top edge surface 200BT may have a triangular profile 21 peaking at about p3.

The series non-oblique protrusions of unequal vertical heights may result in panel 200B having a height h at edges LE and RE, and a different height hc (e.g., about h+t3) at protrusion d3 at about a middle of the panel (located at about center axis C). The height hc at the middle of the panel may be greater than the height h at the edges LE and RE. In other words, at about the middle of panel 200B, surface 200BT may protrude out (in the z axis direction) a further vertical distance (hc−h=t3) over the height h of surface 200BT at edges L and R.

In an example implementation, the height h at edges LE and RE may be between about 2.0 millimeters and 10 millimeters and the vertical distance (hc−h) (corresponding to the protrusion with the largest height (e.g., t3)) may be in a range of a fraction of a millimeter (e.g., 0.1 millimeter) to a few millimeters (e.g., 2.0 millimeters).

In some implementations, the non-oblique protrusion with the greatest height (e.g. e.g., p3 with height t3) may be disposed at a location other than about central axis C.

For example, p3 with height t3 may be disposed near edge L or edge R. Also, there may be more than one protrusion having about the same greatest height (e.g., t3).

FIG. 2D shows, only for purposes of illustration, a limited number of five non-oblique protrusions disposed on top edge surface 200BT. In some implementations, the number of non-oblique protrusions disposed on top edge surface 200BT may be any integer number (including one).

In example implementations, as shown in FIG. 2E, the non-oblique protrusions (e.g., p1, p2, p3, p4, and p5) (and dimples) have generally rectangular shapes or profiles (e.g., in the x-z plane). In example implementations, one or more of the non-oblique protrusions may have another shape or profile (e.g., triangular, trapezoidal, bent rectangle, rounded rectangle, square, triangular, sawtooth, circular, oval, etc.).

Frame 200 may have one or more of panels 200A, 200B, 200C and 200D having shaped edges (e.g., series of protrusions) formed, for example, by oblique protrusions (FIG. 2C) or non-oblique protrusions (FIG. 2E) disposed on the edges. Frame 200 may be used to attach, hold, or fit, a power electronic substrate for inclusion in a power module package.

In example implementations of a power module package, frame 200 may be disposed between a package cover and a power electronic substrate.

Figure 3A:
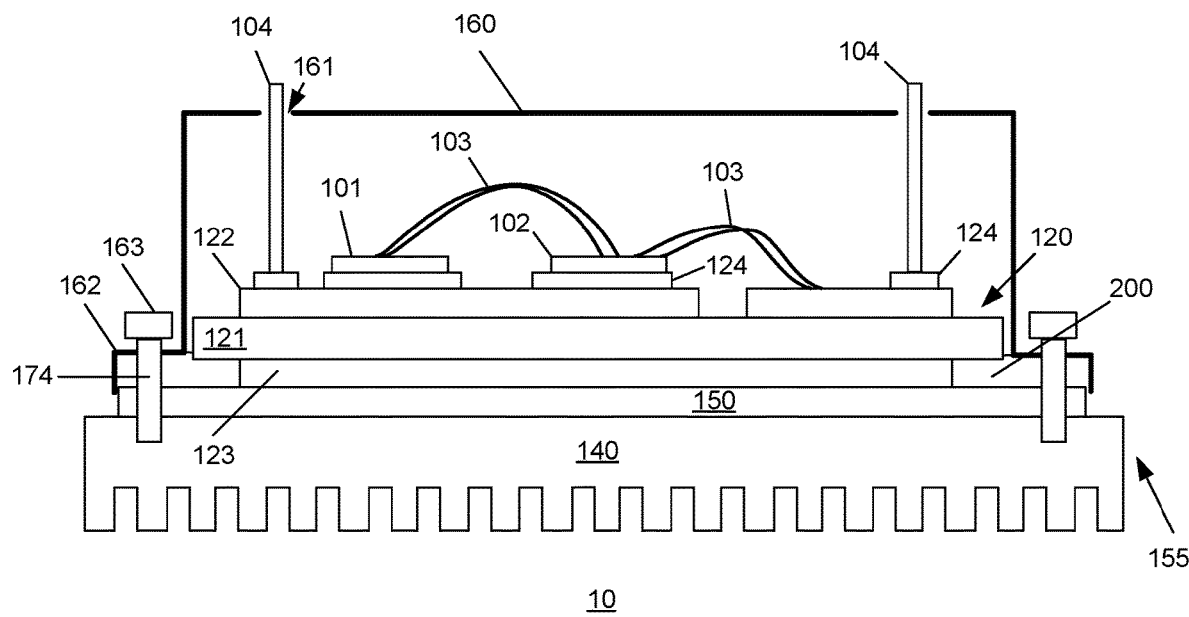
FIG. 3A illustrates a cross sectional view of an example power module package.

FIG. 3A shows a cross sectional view of an example power module package 10 including, for example, frame (e.g., frame 200, FIG. 2A). A DBM substrate (e.g., DBM substrate 120) may be attached to, held by, or fitted in, frame 200.

DBM substrate 120 may include one or more semiconductor device die (e.g., die 101 and die 102) attached to a power electronic substrate (e.g., a printed circuit board (PCB)). Die 101 and die 102 may, for example, include one or more of an IGBT power device and an FRD. In example implementations, the PCB may be a double bonded metal (DBM) substrate (e.g., DBM substrate 120, FIG. 3B). DBM substrate 120 may include a ceramic or dielectric tile 121 having conductive layers (e.g., a printed circuit layer 122 and a conductive back layer 123) formed on the front and back sides of the tile. Circuit layer 122 and back layer 123 may, for example, be made of copper or other conductive material.

Circuit layer 122 may be patterned to include pads for receiving (carrying) circuit components (e.g., die 101, die 102) and other circuit elements (e.g., terminals, interconnections, leads, etc.). The circuit components can include, for example, resistors, capacitors, diodes, light emitting diodes (LEDs), transistors, inductors, integrated circuits, etc.)

Figure 3B:
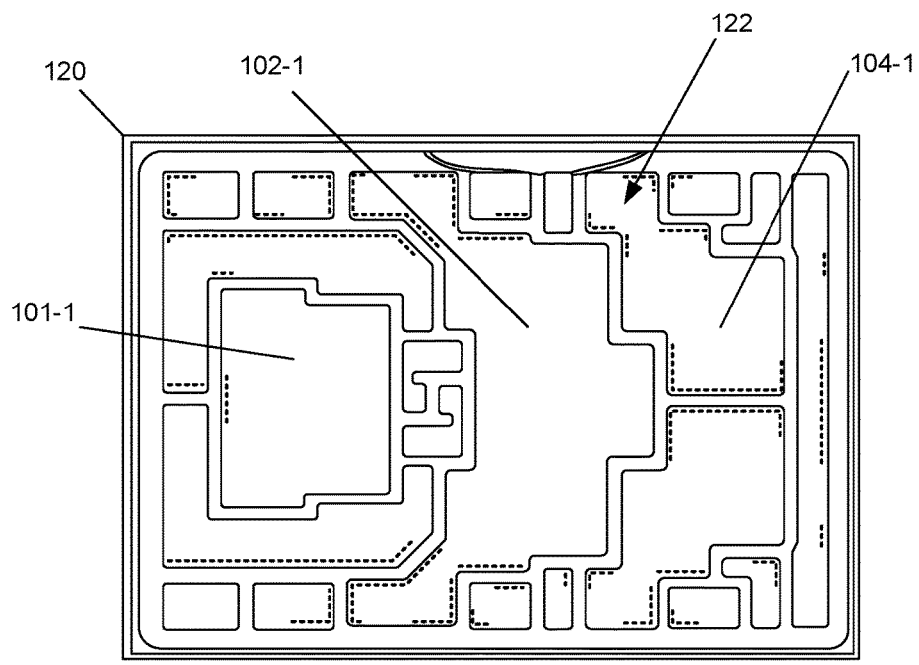
FIG. 3B shows a substrate with a circuit layer.

FIG. 3B shows, for example, DBM substrate 120 with a circuit layer 122 that includes pads (e.g., pads 101-1, 102-1, . . . , 104-1, etc.) for coupling to circuit components (e.g., die 101, die 102, external package leads 104, etc.). DBM substrate 120 may be attached to (e.g., glued to, or fitted in) a frame 200 for inclusion in a power module package as shown in, for example, FIG. 3A.

Referring again to FIG. 3A, the circuit components (e.g., die 101, die 102, external package leads 104, etc.) may be attached to the DBM substrate (e.g., circuit layer 122) using, for example, a conductive attachment material 124 (e.g., a solder or sinter). Further, die 101 and die 102 may, for example, be electrically interconnected to each other, and with other circuit elements (e.g., external package leads 104, etc.) using wires 103.

In package 10, DBM substrate 120 (carrying die 200 and 120) may be attached to (e.g., fitted in, or glued to) frame 200 and affixed to, mounted on, a heat dispersal assembly 155 (including, e.g., a heat exchanger 140) with back layer 123 of the DBM substrate being thermally coupled to heat exchanger 140. A thermally conductive material 150 (e.g., thermal grease, adhesive, solder, etc.) may be used to thermally couple back layer 123 to heat exchanger 140 in heat dispersal assembly 155.

Further, in package 10, a casing (e.g., cover 160) may enclose DBM substrate 120 (carrying die 101 and 102) and frame 200. DBM substrate 120 enclosed in the casing (e.g., cover 160) may be mounted on heat dispersal assembly 155. Frame 200 may include posts 174 of a nut-and-bolt assembly (or a screw arrangement) for receiving bolts or screws (e.g., screw 163) to mechanically affix package 10 to heat dispersal assembly 155. A perimeter rim 162 of cover 160 may be mechanically affixed to heat dispersal assembly 155 using, for example, posts 174 and screw 163 of the nut-and-bolt assembly. Cover 160 may be made of a metal, plastic, glass, polymer, or ceramic material. External package leads 104 may extend out through openings 161 in cover 160.

When installed in package 10, planar support plate 172 (and other surfaces or portions of frame 200) may directly or indirectly contact and press against DBM substrate 120.

The screw mounting process using screw 163 for mechanically affixing perimeter rim 162 of cover 160 to heat dispersal assembly 155 may cause mechanical stress (e.g., torsional stress) that can locally deform or bend portions of cover 160 and frame 200. The series of protrusions on panels (e.g., panels 200A, 200B, 200C and 200D) of frame 200 may act as a spring-like compensator compensating plastic deformation, and twisting or warping of the frame to prevent the stress from propagating to the attached DBM substrate 120.

Figure 4A:
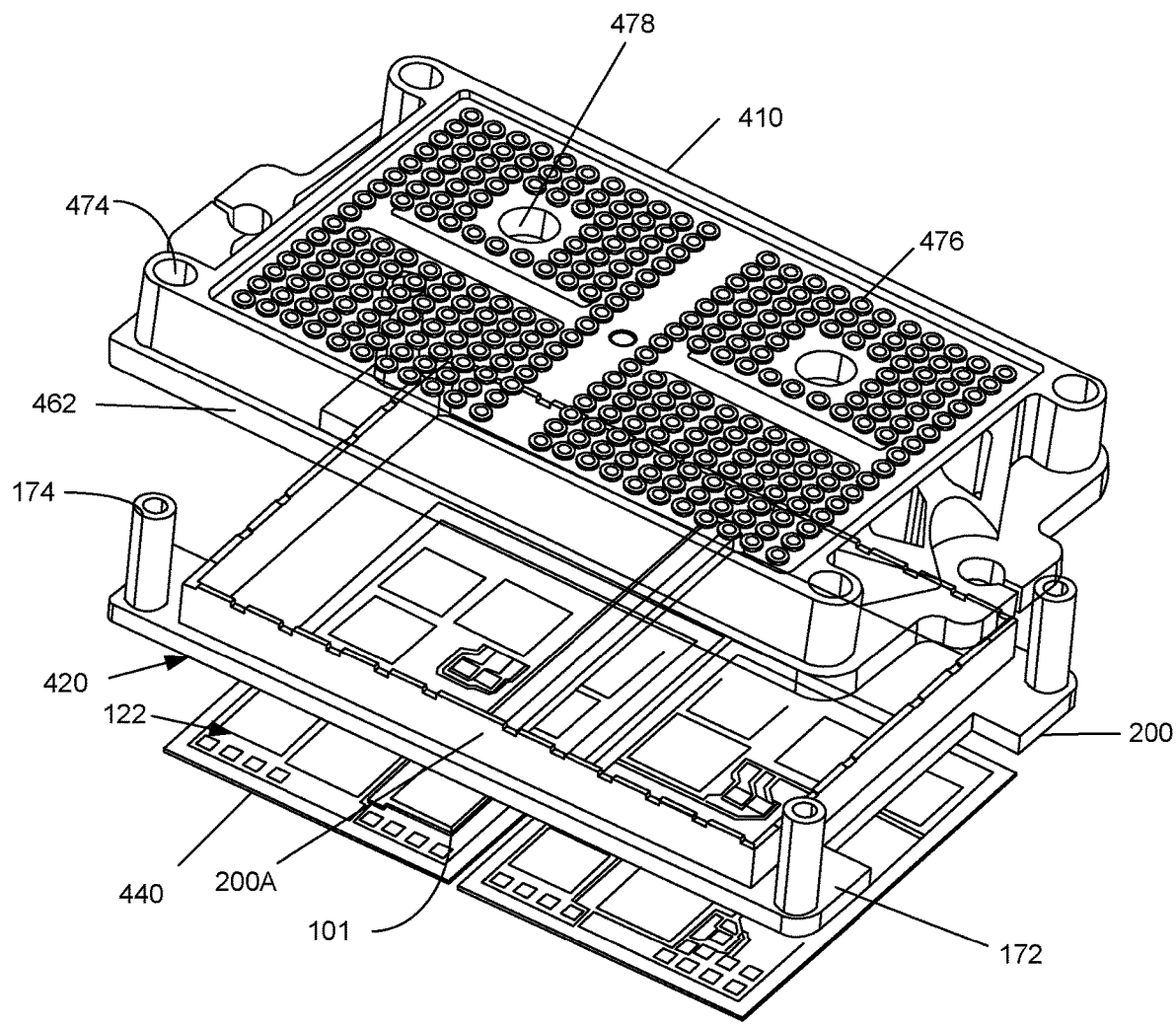
FIGS. 4A through 4C illustrate a power module package and components of the package.
Figure 4B:
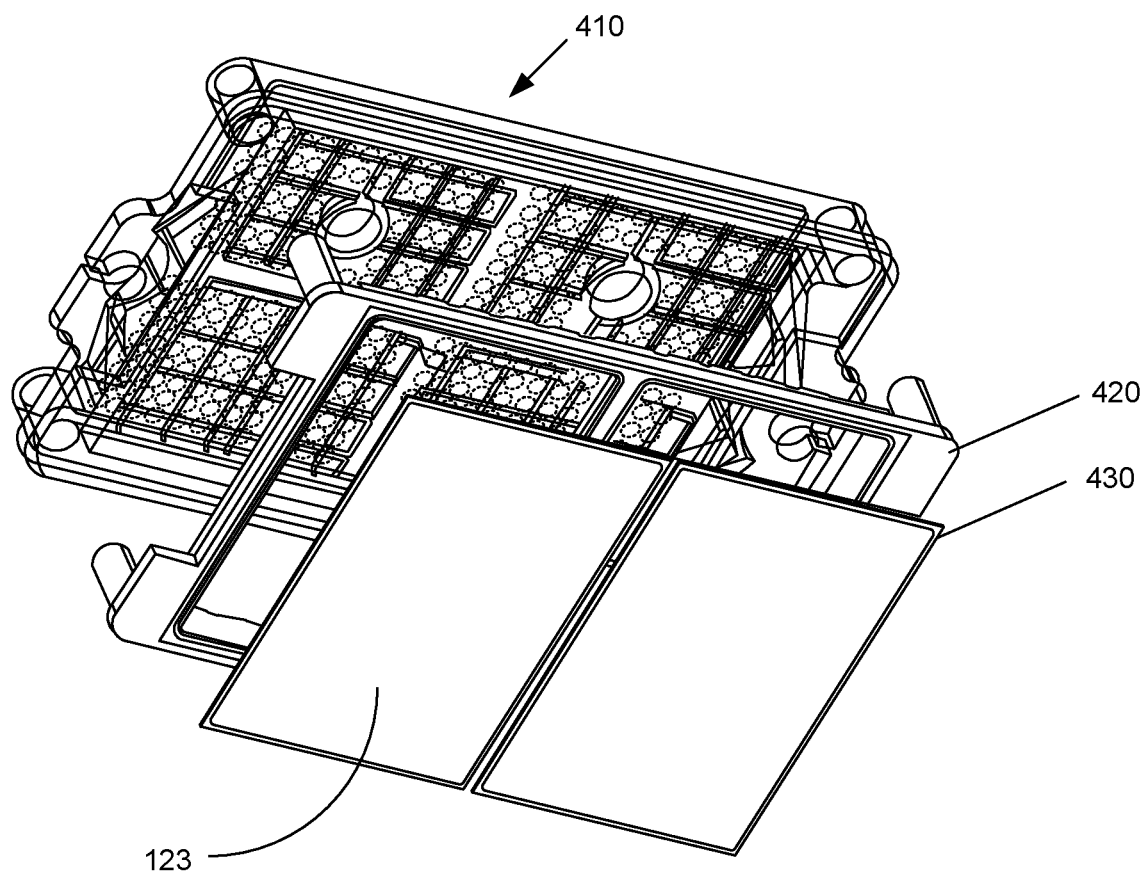
Figure 4C:
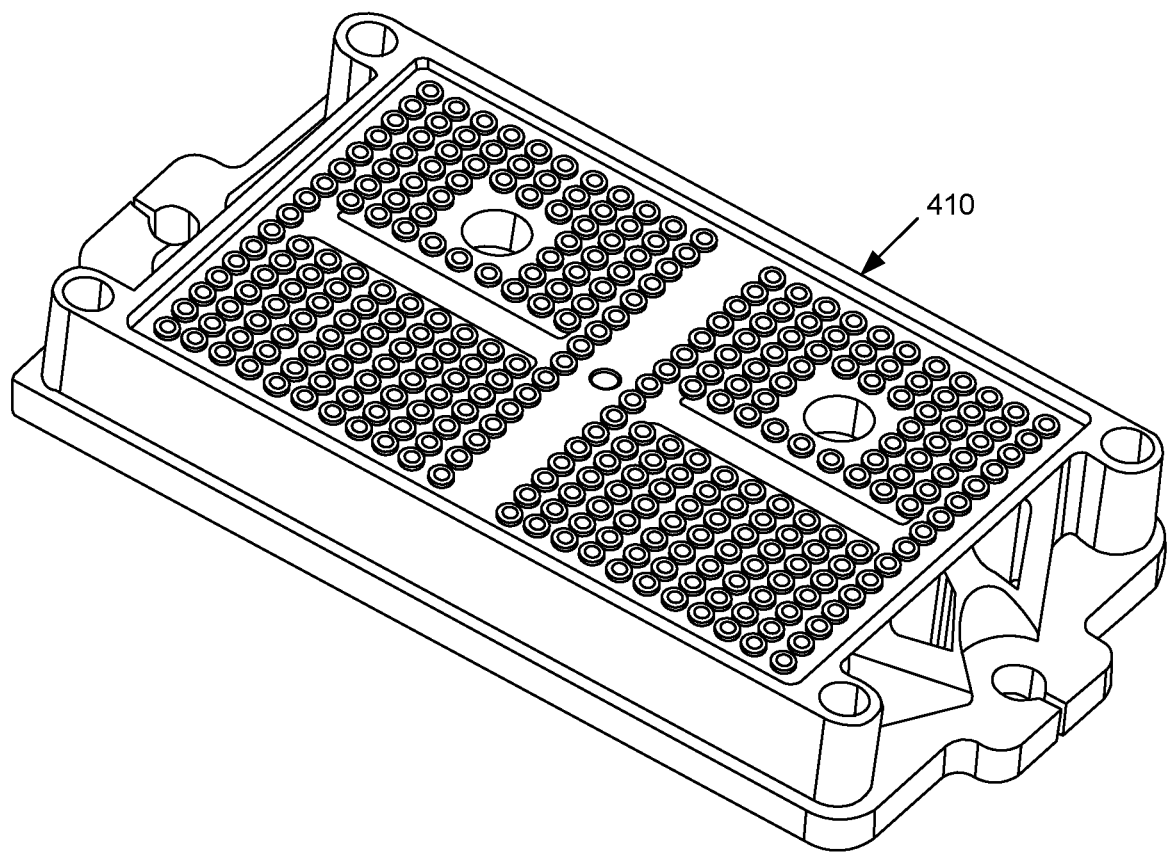

FIGS. 4A and 4B show, for example, a configuration of some of the components (i.e., a package cover 410, a frame 420, and a power electronic substrate 440) that may be included a power module package 400 (FIG. 4C). FIG. 4A is a top perspective view, and FIG. 4B is a bottom perspective view, showing the relative positions and orientations of the components of a partially assembled package 400. FIG. 4C shows a fully assembled package 400, which may be further affixed to a heat dispersal assembly (not shown).

Power electronic substrate 440 may, for example, be a DBM substrate (e.g., DBM substrate 120, FIG. 1B) with a printed circuit layer (e.g., circuit layer 122) carrying one or more circuit components and a conductive backside layer (e.g., back layer 1233). The one or more circuit components may include devices (e.g., die 101) and one or more external package leads (not shown) attached to circuit layer 122. The external package leads may extend perpendicular to substrate 420.

Power electronic substrate 440 may be configured to be attached to, fitted in, or held by, a frame 420. Power electronic substrate 440 may, for example, be glued to frame 420. Frame 420 may be a frame (e.g., frame 200) shaped to reduce the risk of damage to the power electronic substrate during package assembly. For this purpose, frame 420 may include oblique or non-oblique protrusions on panel edges of a rectangular box-like structure in the frame. The oblique or non-oblique protrusions on panel edges (e.g., frame 200) may give a jagged structure to the panel edges. Frame 420 may also include posts 174 of a nut-and-bolt assembly (or a screw arrangement) for affixing package 400 (including package cover 410 and power electronic substrate 440) to the heat dispersal assembly.

Package cover 410, may be made of plastic or polymeric materials. Package cover 410, which may be shaped, for example, like a cap or a tub, may include a perimeter rim (e.g., perimeter rim 462) and alignment guide holes 474 for receiving posts 174 of frame 420 during package assembly. A top of package cover 410 may also include openings 424 for passage of external package leads from power electronic substrate 420 to outside of the package. Package cover 410 may also include openings (e.g., openings 478) to introduce, for example, gel materials into the package (e.g., to seal or encapsulate the one or more circuit components enclosed in the package).

In example implementations, after power electronic substrate 440 is attached to, held by, or fitted in, frame 420. Cover 410 may be aligned and lowered on the frame 420 and substrate 440 combination by passing receiving posts 174 through alignment guide holes 474. FIG. 4C shows power package module 400 after cover 410 is aligned and lowered on frame 420 and substrate 440.

After introducing gel materials (e.g., through openings 478 in cover 410) and curing, power package module 400 may be ready for affixing to a heat dispersal assembly (not shown). The package may be affixed to the heat dispersal assembly by using bolts or screws (e.g., screw 164) passing through posts 174. Damage to the power electronic substrate 420 in the package due to torsional stresses caused by the screw process may be reduced because of the series of protrusions of the frame components (panels) reduce propagation of stresses to the power electronic substrate 420.

FIG. 5 shows an example method 500 for limiting propagation of stress to an electronic substrate enclosed in a power module package via other components of the package.

Method 500 includes disposing a series of protrusions on a rectangular side panel of an open four-sided box-like structure in a frame (510), attaching an electronic substrate to the frame (520), and disposing the frame and attached electronic substrate in a package cover (530). The electronic substrate may carry one or more circuit components.

In method 500, disposing a series of protrusions on the rectangular side panel 510 may include disposing one or more protrusions and dimples on the edge along a length of the rectangular side panel.

In some example implementations, disposing one or more protrusions and dimples on the edge may include disposing an oblique protrusion having a slanted position relative to a horizontal direction along the length of the rectangular side panel.

In some example implementations, disposing one or more protrusions and dimples on the edge may include disposing non-oblique protrusions and dimples along the length of the rectangular side panel.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Galium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises,"

"comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A package, comprising:
    an electronic substrate attached to a frame, the electronic substrate coupled to at least one circuit component, the frame including a rectangular panel having a length and a width, the panel forming a side of an open four-sided box-like structure in the frame, the frame including a portion of an assembly for affixing the package to a heat dispersal assembly; and
    a plurality of pairs of protrusions with a dimple disposed between each pair of protrusions disposed on a top edge of the rectangular panel along the length of the panel.

2. The package of claim 1, wherein one pair of the plurality of pairs of the protrusions is disposed mid-length of the panel.

3. The package of claim 1, wherein at least one protrusion is an oblique protrusion disposed on a slant relative to a horizontal direction along the length of the rectangular panel.

4. The package of claim 3, wherein each of the at least one protrusion has about a same height in a vertical direction along the width of the rectangular panel.

5. The package of claim 1, wherein at least one protrusion of the plurality of pairs of protrusions is a non-oblique protrusion having different heights in a vertical direction along the width of the rectangular panel.

6. The package of claim 1, wherein at least one protrusion of the plurality of pairs of protrusions increases a height of the rectangular panel in a vertical direction along the width of the rectangular panel.

7. The package of claim 1, wherein the plurality of pairs of protrusions form a spring-like compensator.

8. The package of claim 1, wherein at least one protrusion of the plurality of pairs of protrusions has one of a rectangular, a trapezoidal, a triangular, or a curved shape profile.

9. The package of claim 1, wherein the portion includes a nut-and-bolt assembly for affixing the package to the heat dispersal assembly.

10. The package of claim 9 further comprising:
    a cover enclosing the frame and the electronic substrate, the cover to readying the package for attachment to a heat dispersal assembly.

11. A package, comprising:
    an electronic substrate attached to a frame, the electronic substrate being coupled to at least one circuit component; and
    a rectangular panel forming a side of an open four-sided box-like structure in the frame, the rectangular panel having a panel length and a panel width that increases from an end of the rectangular panel toward a midpoint of the panel length so that a top edge surface of the rectangular panel has a slant relative to an axis parallel to the panel length, the rectangular panel further having at least two protrusions separated by a dimple along the panel length, the dimple having a dimple width smaller than a width of each of the at least two protrusions.

12. The package of claim 11, wherein the at least two protrusions and the dimple form a spring-like compensator.

13. The package of claim 11, wherein the at least two protrusions and the dimple are disposed mid-length of the panel.

14. The package of claim 11, wherein at least one of the at least two protrusions is an oblique protrusion disposed on a slant along the length of the rectangular panel.

15. The package of claim 11, wherein at least one of the at least two protrusions is a non-oblique protrusion.

16. The package of claim 11, further comprising, a plurality dimples and wherein the plurality of dimples have bottom surfaces at about a same horizontal level along the length of the rectangular panel.

17. A method, comprising:
  disposing a plurality of pairs of protrusions with a dimple disposed between each pair of protrusions on a rectangular side panel of an open four-sided box-like structure included in a frame, the rectangular panel having a panel length and a panel width that increases from an end of the rectangular panel toward a mid-point of the panel length so that a top edge surface of the rectangular panel has a slant relative to an axis parallel to the panel length; and
  attaching an electronic substrate to the frame, the electronic substrate being coupled to at least one circuit component.

18. The method of claim 17, wherein the disposing includes disposing at least one protrusion paired with at least one dimple, mid-length along a length of the rectangular side panel, on an edge of the panel.

19. The method of claim 18, wherein the disposing includes disposing an oblique protrusion having a slanted position on the edge of the rectangular side panel.

20. The method of claim 18, wherein the disposing includes disposing non-oblique protrusions and non-oblique dimples on the edge along the length of the rectangular side panel.

* * * * *